(12) United States Patent
Bobde (10) Patent No.: US 8,120,142 B2
(45) Date of Patent: Feb. 21, 2012

(54) APPLYING TRENCHED TRANSIENT VOLTAGE SUPPRESSOR (TVS) TECHNOLOGY FOR DISTRIBUTED LOW PASS FILTERS

(75) Inventor: Madhur Bobde, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 568 days.

(21) Appl. No.: 12/148,462

(22) Filed: Apr. 18, 2008

(65) Prior Publication Data

US 2009/0261897 A1 Oct. 22, 2009

(51) Int. Cl.
*H03H 7/00* (2006.01)
(52) U.S. Cl. ......... 257/531; 257/532; 438/243; 333/184
(58) Field of Classification Search .................. 257/528, 257/531, 532, 534; 333/184; 438/238, 239, 438/243, 329
See application file for complete search history.

(56) References Cited

U.S. PATENT DOCUMENTS 6,635,949 B2 10/2003 Lowther et al.
2008/0001186 A1 1/2008 Shastri et al.
2009/0159948 A1* 6/2009 Ho et al. ............ 257/301

FOREIGN PATENT DOCUMENTS

JP 2-299308 * 12/1990

* cited by examiner

*Primary Examiner* — Michael Shingleton
(74) *Attorney, Agent, or Firm* — Bo-In Lin (57) ABSTRACT

An electronic circuit includes a filtering circuit implemented with a distributed inductor-and-capacitor (LC) network that includes metal oxide effect (MOS) trenches opened in a semiconductor substrate filled with dielectric material for functioning as capacitors for the distributed LC network. The electronic circuit further includes a transient voltage suppressing (TVS) circuit integrated with the filtering circuit that functions as a low pass filter wherein the TVS circuit includes a bipolar transistor triggered by a diode disposed in the semiconductor substrate. The distributed LC network further includes metal coils to function as inductors disposed on a top surface of the semiconductor electrically contacting the MOS trenches.

24 Claims, 9 Drawing Sheets

Filter1: Total L= 48n, Total C=48p

Fig. 2A

Filter2: Total L= 48n, Total C=48p

Fig. 2B

Filter3: Total L= 48n, Total C=48p

Fig. 2C

Filter4: Total L= 48n, Total C=48p

Trench Cap vs Nitride Thickness

Fig. 7B

APPLYING TRENCHED TRANSIENT VOLTAGE SUPPRESSOR (TVS) TECHNOLOGY FOR DISTRIBUTED LOW PASS FILTERS

BACKGROUND OF THE INVENTION

1. Field of the Invention

The invention relates generally to a circuit configuration and method of manufacture of a low pass filter. More particularly, this invention relates to an improved circuit configuration and method of manufacture of a low pass filters with improved characteristics of pass band attenuation having increased filter slope achieved by distributed inductor-capacitor networks by implementing trenched transient voltage suppressor (TVS) technologies.

2. Description of the Relevant Art

Figure 1A:
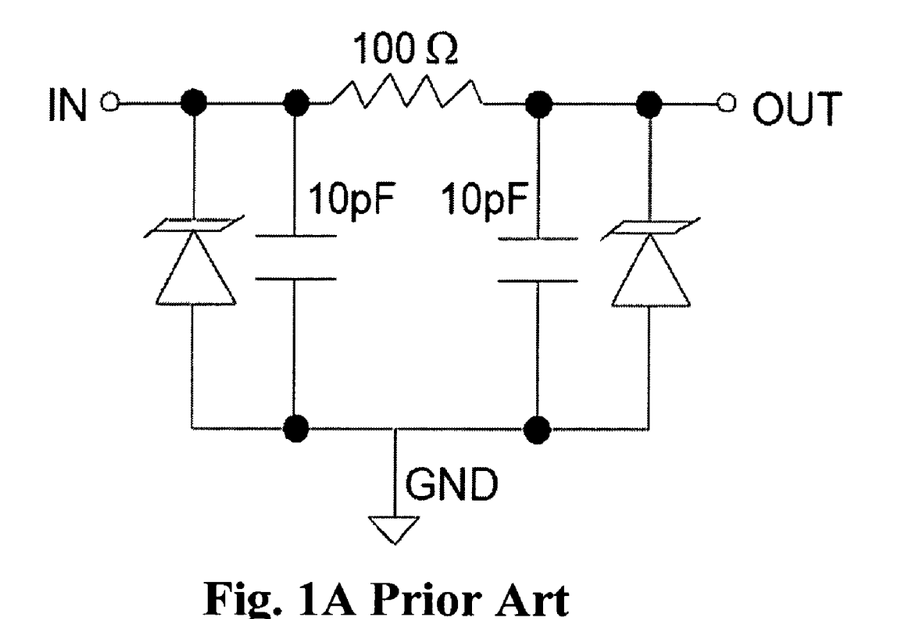
FIGS. 1A to 1B are circuit diagrams and FIG. 1C shows a filtering diagram for illustrating the conventional technologies for implementing the low pass filters.
Figure 1B:
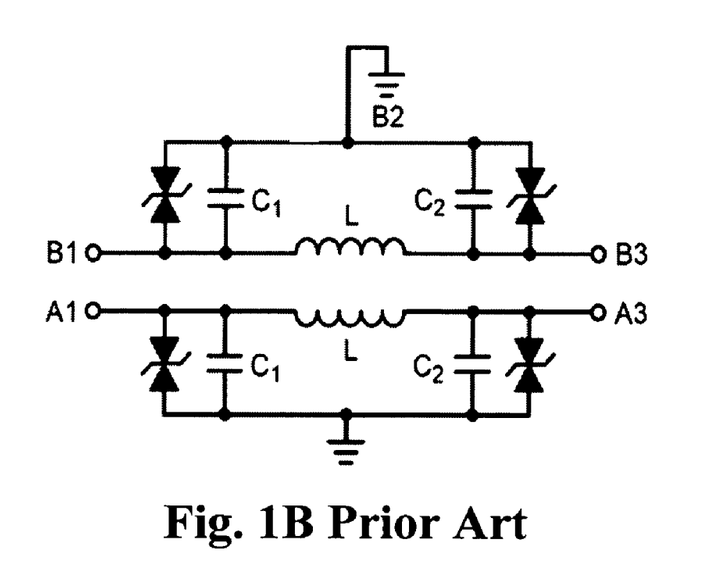

The low pass filters are commonly applied for filtering out radio frequency signals from audio/video/data line signals. Typically, electro-magnetic interference (EMI) filtering and electrostatic discharge (ESD) protection are combined into a single chip by using the capacitance of the Zener diodes to implement the filter as shown in FIG. 1A. Furthermore, filters implemented by combining the resistor-capacitor (RC) and inductor-capacitor (LC) circuits, i.e., combined RC/LC filters, are integrated with the transient voltage suppressing (TVS) circuits as shown in FIG. 1B. The filters have a monolithic characteristic and have the advantages that the parasitic capacitances and inductances are reduced. Additionally, the for typical design of low pass filters to attenuate cellular band signals in the frequency range of 800 MHz to 3 GHz, the filtering performance is improved to achieve a signal attenuation of −25 to −35 dB.

Figure 1C:
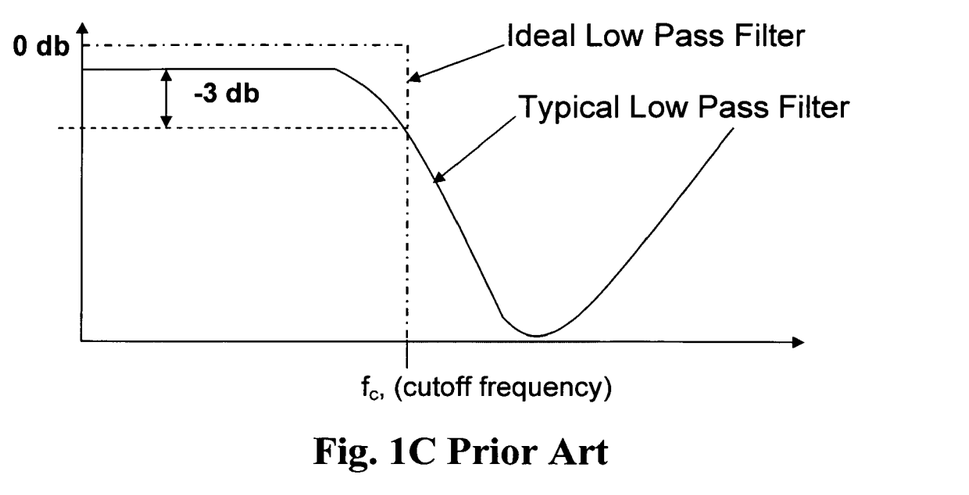

Referring to FIG. 1C for illustrating the performance characteristics of a low pass filter. Typical low pass filter carries out a pass band attenuation by attenuating signals higher than a cutoff frequency fc. The attenuation of the pass band signals, i.e., signals with frequency lower than fc, to the stop band, i.e., signals with frequency higher than fc, has a definite slope that represents a gradual decrease of the signals in a range of frequencies around the cutoff frequency fc. The low pass filter typically has a roll off of signal transmission at high frequencies. In order to improve the filter performance, it is desirable to minimize the pass band attenuation with low series resistance. Implementation of LC (inductor-capacitor) type of low pass filter is more desirable than the RC (resistor-capacitor) type of low pass filters. Furthermore, it is desirable to increase the slope of the low pass filter. Theoretical analyses have demonstrated that distributed inductor-capacitor network instead of lumped LC filter has the advantage of generating a sharper attenuation with greater filter slope. Specifically, slope can be defined as:

Slope=20n db/decade

Where n is the number of poles of the distributed LC network as that implemented in the LC network. It is therefore desirable to configure a LC low pass filter with a distributed LC network with greater number of poles. However, a distributed LC network when implemented in the low pass filter can increase the size and further generate increase amount of parasitic capacitances, inductances and resistances. Conventional method of configuring and manufacturing a LC network low pass filter is therefore not able to take advantage of the distributed LC network to improve the filter performance.

Therefore, a need still exists in the fields of circuit design and device manufactures for providing a new and improved circuit configuration and manufacturing method to resolve the above-discussed difficulties. Specifically, a need still exists to provide new and improved low pass filter circuits that can minimize the pass band attenuation with low series resistance while increasing the filter slope. The new and improved low pass filter with increased number of poles by implementing the distribute LC network circuit must also configurable and conveniently manufacturable as integrated circuits of compact size and reduced parasitic effects due to the distributed LC network circuits such that the above discussed difficulties and limitations can be resolved.

SUMMARY OF THE PRESENT INVENTION

It is therefore an aspect of the present invention to provide an improved filter circuit to have an improved filtering performance with further reduced attenuation and increased filter slope. The improvement of the filtering performance is achieved by distributed inductor-capacitor (LC) network. The distributed LC network is implemented by applying trenched MOS configurations by parallel trenched gates formed as capacitors and metal contacts above the capacitors formed as coils to function as inductors. This invention thus discloses filter configurations to overcome and resolve the above discussed limitations and difficulties as encountered in the conventional technologies.

Another aspect of this invention is to provide improved filtering configuration by applying MOS technologies to form the distributed LC network to implement various linear polynomial filters with adjustable capacitances and inductances. The capacitance and inductances are flexibly adjustable by adjusting the materials and configuration dimensions of the parallel trenched capacitors and contact metal coils to function as the inductors connected to the trenched capacitors.

Another aspect of this invention is to provide improved filtering configuration by applying MOS technologies to form the distributed LC network by adjusting the values of the capacitance of the trenched capacitors with added nitride layer to the dielectric layer. By adjusting the percentage and thickness of the dielectric layers comprising a nitride layer provides the flexibilities to adjust the capacitance of the trenched capacitors thus further improve the filter performances.

Briefly in a preferred embodiment this invention discloses an electronic circuit. The electronic circuit includes a filtering circuit implemented with a distributed inductor-and-capacitor (LC) network that includes metal oxide effect (MOS) trenches opened in a semiconductor substrate filled with dielectric material for functioning as capacitors for the distributed LC network. In an exemplary embodiment, the electronic circuit further includes a transient voltage suppressing (TVS) circuit integrated with the filtering circuit that functions as a low pass filter wherein the TVS circuit includes a bipolar transistor triggered by a diode disposed in the semiconductor substrate. In another exemplary embodiment, the distributed LC network further includes metal coils to function as inductors disposed on a top surface of the semiconductor electrically contacting the MOS trenches. In another exemplary embodiment, the distributed LC network further includes a transient voltage suppressing (TVS) circuit integrated with the filtering circuit functioning as a low pass filter wherein the TVS circuit includes a bipolar transistor. The distributed LC network further includes metal coils disposed on a top surface of the semiconductor substrate electrically contacting the MOS trenches and the bipolar transistor having an electrical terminal connecting to the metal coils functioning as an input/output port for the TVS circuit. In another exemplary embodiment, the MOS trenches are filled with doped polysilicon with sidewalls of the MOS trenches padded with a dielectric material. In another exemplary embodiment, the electronic circuit further includes a transient voltage suppressing (TVS) circuit integrated with the filtering circuit wherein the TVS includes a bipolar transistor includes a N doped region functioning as a collector encompassed in a P-body well supported on a N-substrate having a bottom surface functioning as a emitter for the bipolar transistor. The TVS circuit further includes a lateral Zener diode formed by the N doped collector and a shallow P trigger implant region for triggering the bipolar transistor and minimizing the snapback in the TVS output characteristics. The distributed LC network further includes metal coils disposed on a top surface of the semiconductor substrate electrically contacting the MOS trenches to function as inductors for the LC network and the bipolar transistor having an electrical terminal connecting to the metal coils functioning as an input/output port for the TVS circuit; and the second N-doped region of the Zener diode further contacting the metal coil for functioning as a cathode. In another exemplary embodiment, the MOS trenches are filled with doped polysilicon with sidewalls of the MOS trenches padded with the dielectric layer includes a silicon oxide layer. In another exemplary embodiment, the MOS trenches are parallel and electrically coupled trenches to function as capacitors for the distributed LC network. In another exemplary embodiment, the MOS trenches are parallel and electrically coupled trenches having a depth substantially between two to seven micrometers and distance between two adjacent trenches substantially between 0.5 to 3 micrometers to function as capacitors for the distributed LC network. In another exemplary embodiment, the distributed LC network further includes metal coils disposed on a top surface of the semiconductor configured as a circular coil and electrically contacting the MOS trenches to function as inductors for the LC network. In another exemplary embodiment, the distributed LC network further includes metal coils disposed on a top surface of the semiconductor configured as a hexagonal coil and electrically contacting the MOS trenches to function as inductors for the LC network. In another exemplary embodiment, the distributed LC network further includes metal coils disposed on a top surface of the semiconductor configured as a square coil and electrically contacting the MOS trenches to function as inductors for the LC network. In another exemplary embodiment, the distributed LC network further includes metal coils disposed on a top surface of the semiconductor configured as an octagonal coil and electrically contacting the MOS trenches to function as inductors for the LC network. In another exemplary embodiment, the MOS trenches are filled with doped polysilicon with sidewalls of the MOS trenches padded with a dielectric layer includes a nitride dielectric layer and an oxide dielectric layer.

This invention further discloses an electronic circuit that includes a filtering circuit. The filtering includes a linear polynomial filter implemented with an inductor-and-capacitor (LC) ladder network that includes metal oxide effect (MOS) trenches opened in a semiconductor substrate filled with dielectric material functioning as capacitors for the LC ladder network. In an exemplary embodiment, the LC ladder network further includes metal coils to function as inductors disposed on a top surface of the semiconductor electrically contacting the MOS trenches. In another exemplary embodiment, the LC ladder network constituting a Butterworth filter. In another exemplary embodiment, the LC ladder network constituting a Chebyshev filter. In another exemplary embodiment, the LC ladder network constituting a Elliptic filter. In another exemplary embodiment, the LC ladder network constituting a Butterworth filter includes represented by L2, L4, L6, . . . , Ln−1, and capacitors represented by C1, C3, C5, . . . , Cn wherein n is an integer representing an order of the LC ladder network and values of capacitances $C_k$ and inductance $L_k$ are represented by:

$$C_k = 2\sin[(2k-1)\pi/(2n)]/\omega_c\ k = \text{odd}$$

$$L_k = 2\sin[(2k-1)\pi/(2n)]/\omega_c\ k = \text{even}$$

The present invention further discloses a method to manufacture an electronic circuit. The method includes a step of forming a filtering circuit in a semiconductor substrate as a distributed inductor-and-capacitor (LC) network by opening a plurality of metal oxide effect (MOS) trenches in the semiconductor substrate and filling the MOS trenches with dielectric material to function as capacitors for the distributed LC network. In an exemplary embodiment, the method further includes a step of integrating a transient voltage suppressing (TVS) circuit with the filtering circuit by forming the filtering circuit as a low pass filter and forming the TVS in the semiconductor as a bipolar transistor and a triggering diode with on of an electrical terminal functioning as an input/output port for the low pass filter. In another exemplary embodiment, the step of forming the distributed LC network further includes a step of depositing a metal layer and patterning the metal layer into metal coils on top of the semiconductor substrate in electrical contact to the MOS trenches to function as inductors for the LC network.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2A:
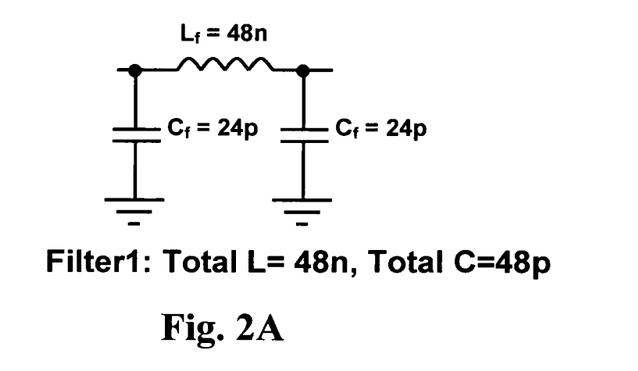
FIGS. 2A to 2D are circuit diagrams for showing the LC networks to implement the low pass filter and FIG. 2E is a filtering diagram to show the improvements of the filtering performances of different LC network filters shown in FIGS. 2A to 2D.
Figure 2B:
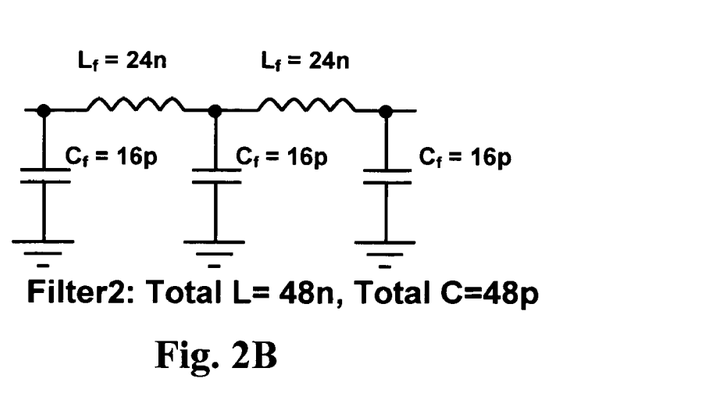
Figure 2C:
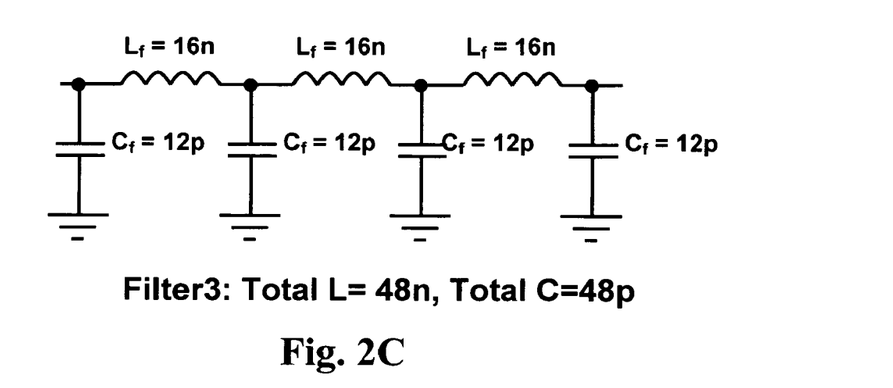
Figure 2D:
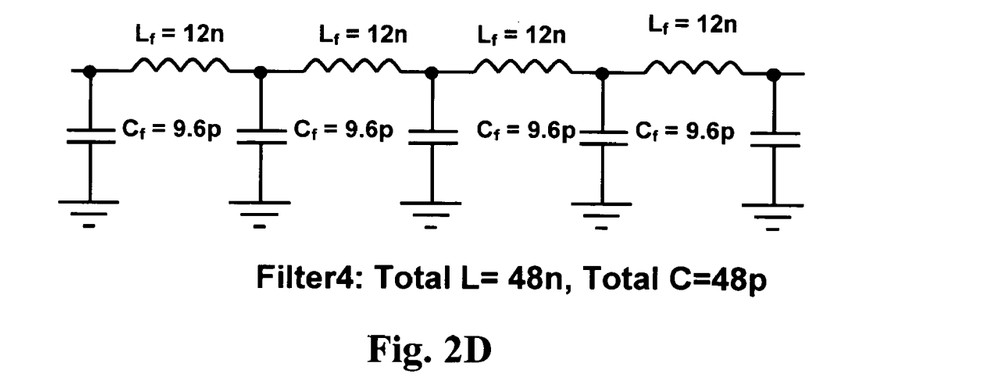
Figure 2E:
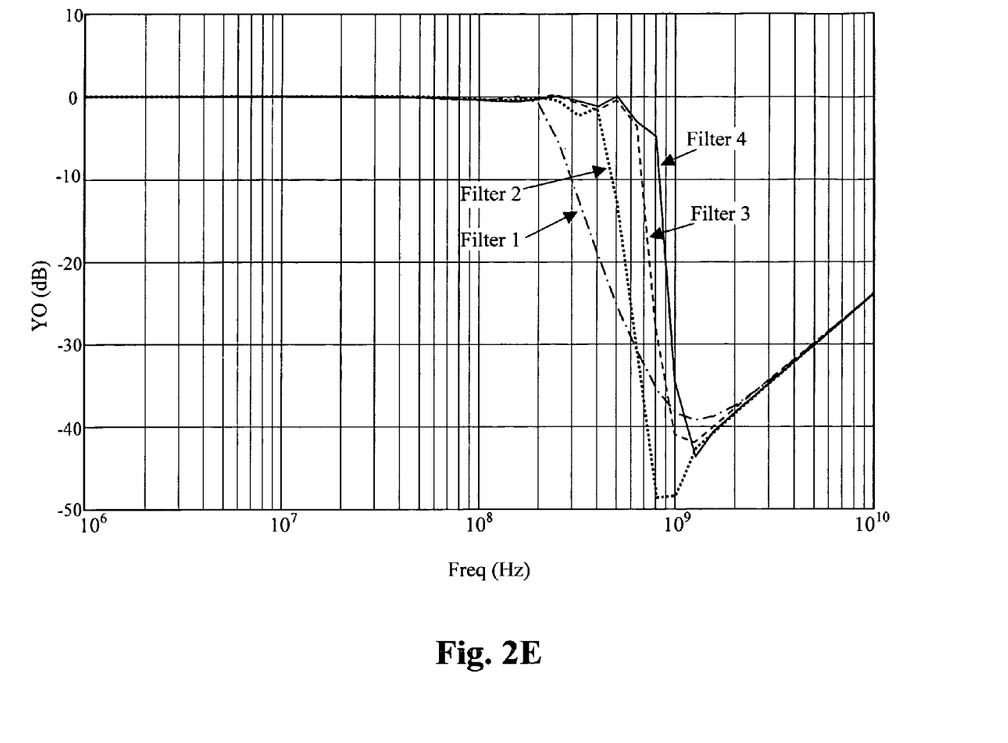

For better understanding of this invention, the descriptions of the FIGS. 2A to 2E below are provided as background reference information of the low pass filter implemented with distribute LC networks. FIGS. 2A to 2D are respectively circuit diagrams of low pass filters comprise inductors and capacitors. The total inductance is 48n and the total capacitance is 48p. In FIGS. 2B to 2D, instead of lumped LC network as shown in FIG. 2A, distributed inductors and capacitors are implemented to form the low pass filter while maintaining the total inductance and capacitance unchanged at 48n and 48p respectively. The distributed LC networks shown in FIGS. 2B to 2D have more poles compared to the lumped LC network when implemented for the low pass filter. FIG. 2E compares the insertion loss for each of the four low pass filters that are implemented with different numbers of LC networks as shown in FIGS. 2A to 2D respectively. FIG. 2E clearly illustrates that the distributed LC network with more poles have additional advantages of increasing filter slope (db/decade) and provide low pass filters with a wider pass band frequency.

Figure 3A:
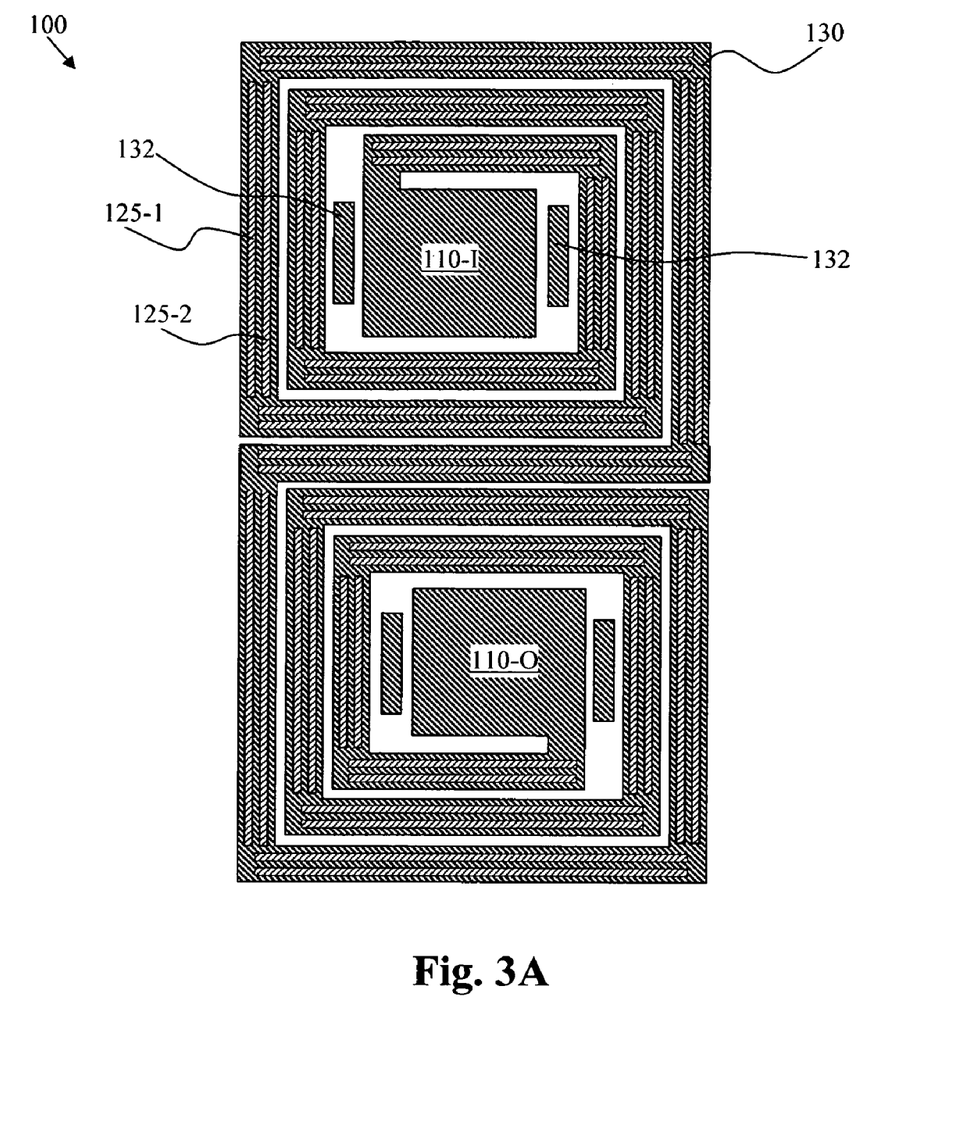
FIGS. 3A and 3B are respectively a top view and a cross sectional view and FIG. 3C is an equivalent circuit diagram of the distributed LC-network low pass filter implemented with trenched capacitors with contact metal formed as inductor coils of this invention.
Figure 3B:
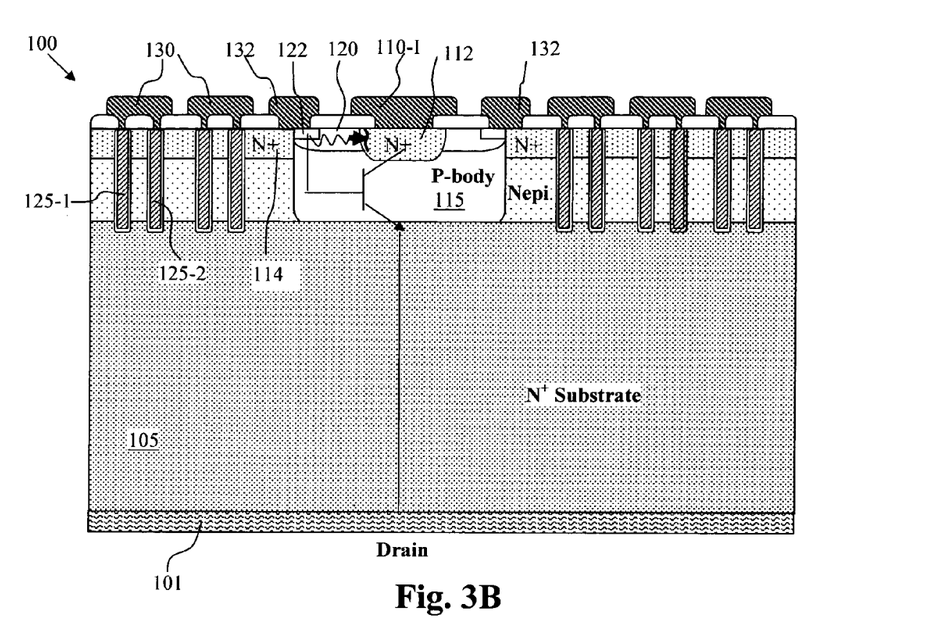
Figure 3C:
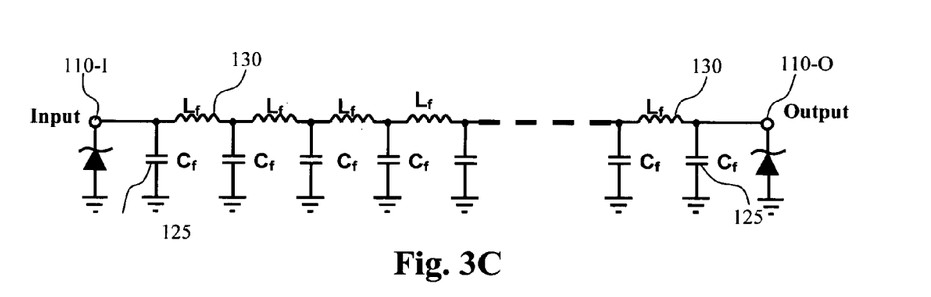

FIGS. 3A and 3B are a top view and a cross sectional view of a low pass filter integrated with the transient voltage suppressor (TVS) circuit and implemented as inductor-capacitor (LC) networks according to an exemplary embodiment of this invention. The low pass filter 100 includes an input electrode 110-I on top of an N+ doped region 112 functioning as a collector for a bipolar NPN formed with P-body well 115 supported on top of an N+ substrate 105 with a ground electrode 101 disposed at the bottom surface of substrate functioning as emitter. The bipolar NPN transistor may be triggered by a lateral Zener diode formed at the junction between N+ doped regions 112 and the neighboring P doped region 120 encompassed inside body region 115 with cathode connected to the input electrode 110-I. The P region 120 has a higher dope concentration than the P body well 115 therefore the lateral junction between P region 120 and N+ region 112 will breakdown first functioning as a Zener diode when subject to a transient high voltage. The P region 120 connects through a P+ contact implant region 122 to form an ohmic contact to metal 132, which also connects to the ground electrode through N epitaxial layer and N+ substrate. An N+ region 114 is provided to facilitate ohmic contact to metal 132. In operation, the voltage drop over the current path from P region 120 to ground electrode provides the base bias to turn on the NPN bipolar. Together the Zener diode and bipolar NPN forms a Zener trigger bipolar TVS. The parallel trenched MOS capacitors 125-1 and 125-2 are further in contact with contact metal 130 on top of the trenched 125-1 and 125-2 formed as a coil surrounds the input electrode 110 to function as inductors coupling between the capacitors as shown in FIG. 3C. The low pass filter 100 further includes an output electrode 110-O having similar structure and configuration as the input terminal. According FIGS. 3A to 3C, the metal coils 130 formed on the top surface of the substrate function as the inductor and the trench MOS capacitor under the inductor metal coils are connected to the inductor to provide the LC-network for the low pass filter. The values inductance and the capacitance of the filter, i.e., L-filter and C-filter can be flexibly adjusted by varying the width of the metal coils and trenches to configure the low pass filter with improved performance.

In one embodiment, each capacitor is formed by a pair of parallel and electrically coupled trenched MOS capacitors with the trenches between 2 to 7 um in depth, and having a width between 0.5 to 3 um, and between 1 to 4 um spacing between the trenches. The trenches are filled with conductive material with a thin layer of dielectric material lining the sidewalls of the trenches to insulate the trench-filled conductive material from the trench sidewalls. In one embodiment, the trenches are filled with doped polysilicon. In another embodiment, the trench sidewalls are lined with an silicon dioxide thin layer; In another embodiment, the trenches sidewalls are lined with combination of nitride and oxide to increase the capacitances. Depending on the arrangement of trench MOS capacitors, the inductor coil may be patterned in square, hexagonal, octagonal, circular or other shapes to optimize the performance of filter. Design parameters of different coil-shaped inductor may be induced from the expressions published by Mohan et. al. (IEEE J. of Solid-State Circuits, Vol. 34, NO. 10, October, 1999). The disclosures made in that published paper is hereby incorporated by reference in this patent application.

Figure 4:
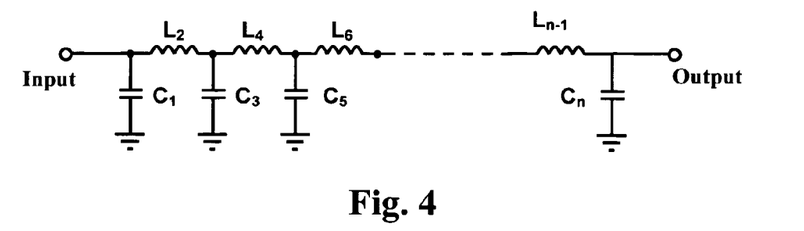
FIG. 4 is a circuit diagram to illustrate the LC networks for implementing different linear polynomial filters.

In addition to the low pass filter as described above, the inductor-capacitor networks can also be applied to form linear polynomial filters such as Butterworth, Chebyshev, Elliptic filters. These types of filters are implemented with LC ladder networks as that shown in FIG. 4. The inductances of the inductors L2, L4, L6, . . . , Ln−1 and the capacitances of the capacitor C1, C2, C3, . . . , Cn as shown in FIG. 4 can be adjusted to implement different kinds of filters according to the linear polynomials. For example, a Butterworth filter, the values of C and L are represented as:

$$C_k = 2 \sin[(2k-1)\pi/(2n)]/\omega_c, k=\text{odd}$$

$$C_k = 2 \sin[(2k-1)\pi/(2n)]/\omega_c, k=\text{even}$$

Wherein n represents the order of the filter. The capacitance is dependent on the surface area, i.e., trench sidewalls area, as well as the dielectric layer separating the trenched conductive material from the surrounding semiconductor material. So the depth and length will determine the value of the capacitance of the trench MOS capacitors. The width of trenches has no direct effects on the capacitance value of MOS capacitor. To increase the capacitance, multiple trenches may be connected in parallel to form paralleled connected trenched MOS capacitors. In that aspect it is desirable to minimized the trench width and spacing so that capacitance is maximized for a given area. This is limited by the line width of the technology used. A determination of the value of the inductance of the inductors shown in FIGS. 3A and 3B is more complicated and is fully disclosed by Mohan et. al. (IEEE J. of Solid-State Circuits, Vol. 34, No. 10, October, 1999). Again, the disclosures made in that published paper is hereby incorporated by reference in this patent application.

Figure 5A:
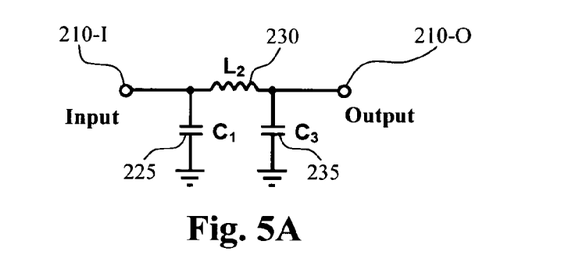
FIGS. 5A and 5B are respective a circuit diagram and a top view of a third order filter implemented with trenched capacitor and metal contact coils of this invention.
Figure 5B:
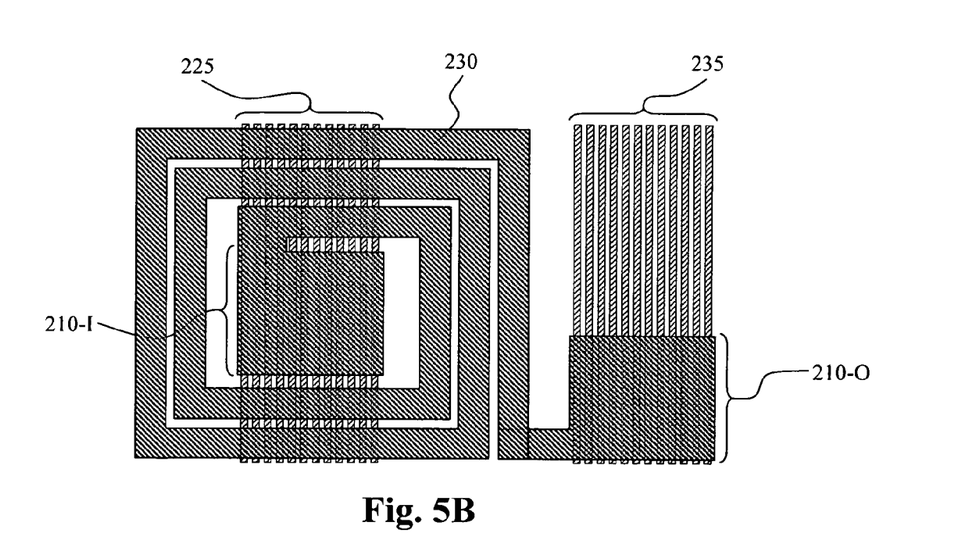

The linear polynomial filters as described above can be conveniently implemented by using the metal coils 130 and the capacitors 125-1 and 125-2 as shown in FIGS. 3A and 3B. Some examples are shown in FIGS. 5A and 5B for a third order filter and FIGS. 6A and 6B for a fifth order filter. The third order filter as shown in FIG. 5A includes three elements: two capacitors 225 and 235 connected by inductor 230. In FIG. 5B, the two capacitors are formed by etching a plurality of parallel trenches into the substrate then line the trenches with a thin layer of dielectric material to form MOS capacitors by filling the trenches with conductive material such as metal or doped polysilicon. A dielectric layer such as oxide may be provided to cover the top surface with contact openings to each MOS capacitor trench etched at certain locations. A metal layer is deposited over the top surface covering the oxide layer and contacting the doped polysilicon in each trench through the contact openings. The metal is then patterned to form the coil 230 as well as input electrode 210-I and output electrode 210-O. As shown in FIG. 5B, contacts to the trenches of MOS capacitor 225 may be formed under the area of input electrode 210-I and contacts to the trenches of MOS capacitor 235 may formed under the area of output electrode 210-O.

Figure 6A:
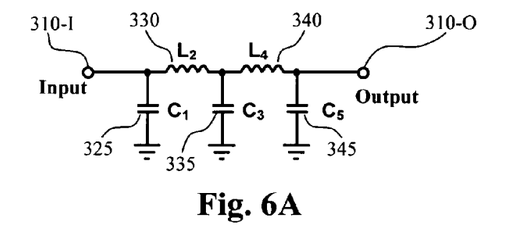
FIGS. 6A and 6B are respective a circuit diagram and a top view of a fifth order filter implemented with trenched capacitor and metal contact coils of this invention.
Figure 6B:
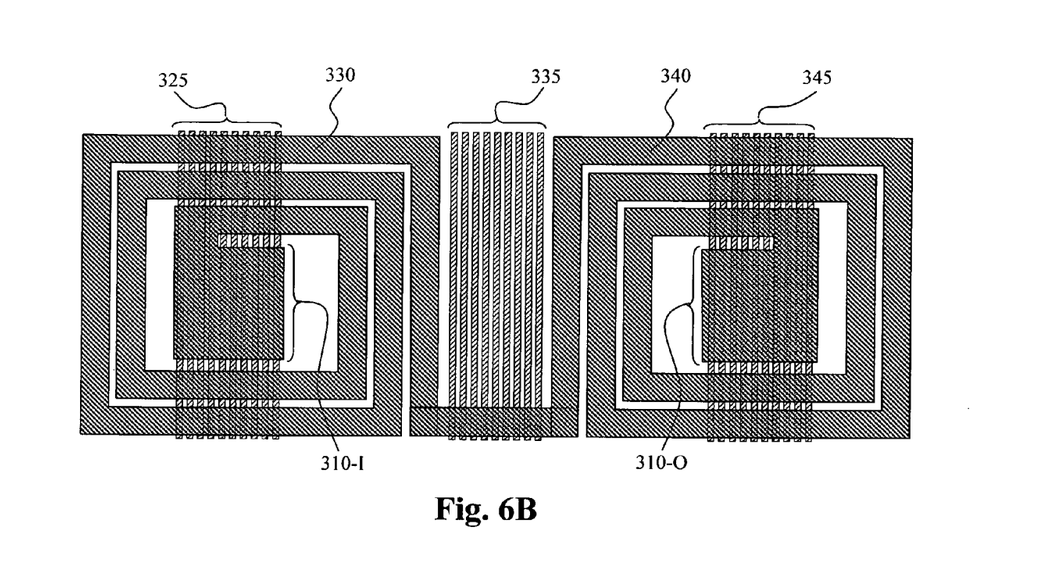

The fifth order filter in FIG. 6A includes five elements: three capacitors 325, 335 and 345 connected by two inductors 230 and 240. In FIG. 6B, the three capacitors are formed by etching a plurality of parallel trenches into the substrate then line the trenches with a thin layer of dielectric material to form MOS capacitors by filling the trenches with conductive material such as doped polysilicon or metal. An dielectric layer such as oxide may be provided to cover the top surface with contact openings to each MOS capacitor trench etched at certain locations. A metal layer is deposited over the top surface covering the oxide layer and contacting the doped polysilicon in each trench through the contact openings. The metal is then patterned to form the coils 330 and 340 as well as input electrode 310-I and output electrode 310-O. As shown in FIG. 6B, contacts to the trenches of MOS capacitor 325 may be formed under the area of input electrode 310-I and contacts to the trenches of MOS capacitor 345 may be formed under the area of output electrode 210-O; contacts to the trenches of MOS capacitor 335 may be formed over the whole trench length or only a part of trench length.

Figure 7A:
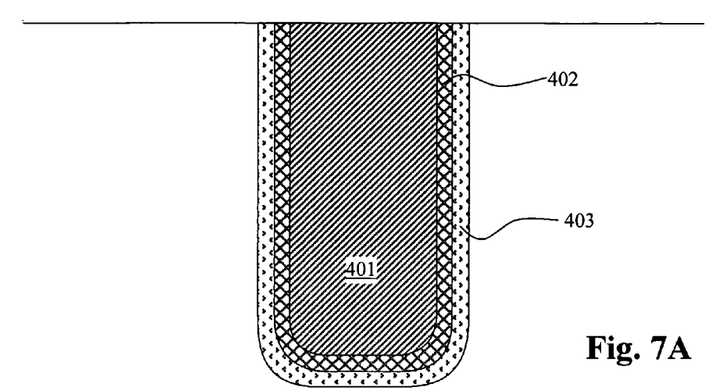
FIG. 7A is a cross sectional view for illustrating another embodiment of this invention wherein the trenched capacitors are formed with dielectric insulation formed with nitride layer and regular insulation layer to further increase the capacitance of the trenched capacitors of the filters of this invention.
Figure 7B:
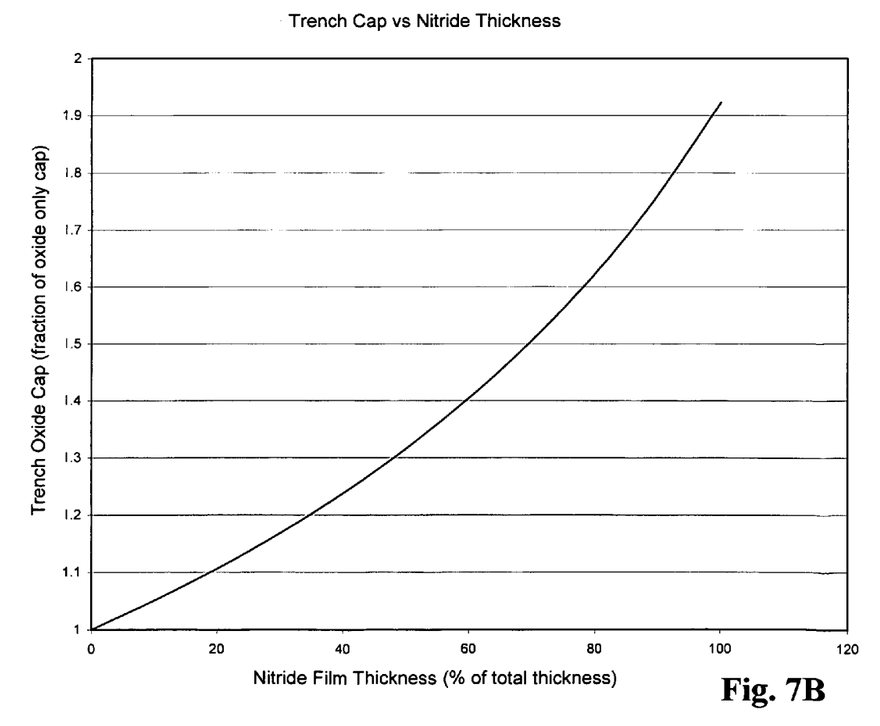
FIG. 7B is a diagram to show the variation of capacitance changes with the thickness of the nitride dielectric of a combined nitride-oxide dielectric layer with constant total combined thickness.

FIG. 7A is a cross sectional view of another embodiment, where the MOS trenches 401 to form the capacitors are lined with dielectric layers that include nitride 402 layer to increase the capacitance of the capacitors. Furthermore, by adjusting the thickness of the nitride layer, the capacitance of the trenched capacitors in the LC network can be flexibly adjustable. FIG. 7B shows the increase of the capacitance of the trench MOS capacitor with increasing thickness of the nitride layer 402 while keeping the total thickness of the combined dielectric layer of a nitride dielectric (Si3N4) layer 402 and an oxide dielectric (SiO2) layer 403 constant. Therefore, the capacitance of the filtering circuits can be flexibly adjusted by adjusting the thickness of the nitride dielectric layer while keeping the total thickness of the combined dielectric layer constant. Flexibilities and application ranges of the filtering circuits can be expanded and improved with such tunable capacitances by adjusting the relative thickness of the nitride and the oxide layers.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An electronic circuit comprising:
a filtering circuit includes distributed inductor-and-capacitor (LC) network comprising metal oxide effect (MOS) trenches opened along a vertical direction in a semiconductor substrate filled with a conductive material functioning as capacitors connected to metal strips configured as inductor coils disposed on a top surface of said semiconductor constituting interconnected inductors and with said MOS trenches opened in said semiconductor substrate underneath said metal strips constituting said capacitors for said distributed LC network.

2. The electronic circuit of claim 1 further comprising:
a transient voltage suppressing (TVS) circuit comprises an input I/O pad functioning as a collector of a bipolar transistor comprising dopant regions of different conductivity types underneath said I/O Pad in said semiconductor substrate having a bottom layer functioning as an emitter wherein said metal strips and said MOS trenches surrounding said I/O pad to integrate as said filtering circuit to integrate with said TVS for functioning as a low pass filter through a Zener diode formed as a PN junction disposed in said semiconductor substrate comprising a body dopant region adjacent to a source dopant region under said input I/O pad as part of said bipolar transistor.

3. The electronic circuit of claim 1 wherein:
said MOS trenches are opened as parallel trenches opened vertically into said semiconductor substrate along both sides of said metal strips.

4. The electronic circuit of claim 1 further comprising:
a transient voltage suppressing (TVS) circuit comprises an input I/O pad functioning as a collector of a bipolar transistor comprising dopant regions of different conductivity types underneath said I/O Pad in said semiconductor substrate having a bottom layer functioning as an emitter wherein said metal strips and said MOS trenches surrounding said I/O pad to integrate as said filtering circuit to integrate with said TVS for functioning as a low pass filter through a Zener diode formed as a PN junction disposed in said semiconductor substrate comprising a body dopant region adjacent to a source dopant region under said input I/O pad as part of said bipolar transistor; and
said input I/O pad of said bipolar transistor is formed as part of to said metal coils for inputting a transient voltage to said TVS circuit.

5. The electronic circuit of claim 1 wherein:
said MOS trenches are filled with doped polysilicon electrically connected to said metal strips with sidewalls of said MOS trenches padded with a dielectric material covering said sidewalls of said MOS trenches.

6. The electronic circuit of claim 1 further comprising:
a transient voltage suppressing (TVS) circuit comprises an input I/O pad functioning as a collector of a bipolar transistor comprising a N-dopant region in a P-body well on top of an N-epitaxial layer in said semiconductor substrate having a bottom layer below the N-epitaxial layer functioning as an emitter for said bipolar transistor wherein said metal strips and said MOS trenches surrounding said I/O pad to integrate as said filtering circuit to integrate with said TVS for functioning as a low pass filter through a Zener diode formed as a PN junction disposed in said semiconductor substrate comprising a P-body dopant region adjacent to the N-dopant region under said input I/O pad as part of said bipolar transistor.

7. The electronic circuit of claim 1 wherein:
said MOS trenches are filled with doped polysilicon electrically connected to said metal strips with sidewalls of said MOS trenches padded with said dielectric layer formed as a silicon oxide layer covering said sidewalls of said MOS trenches.

8. The electronic circuit of claim 1 wherein:
said MOS trenches are opened as parallel trenches filled with doped polysilicon and electrically connected to said inductor coils disposed on the top surface of the semiconductor substrate to wherein said MOS trenches are electrically coupled between adjacent trenches to function as capacitors for said distributed LC network.

9. The electronic circuit of claim 1 wherein:
said MOS trenches are opened as parallel trenches filled with doped polysilicon having a depth substantially between two to seven micrometers and having a distance between two adjacent trenches substantially between 0.5 to 3 micrometers wherein said MOS trenches are electrically connected to said inductor coils disposed on the top surface of the semiconductor substrate to function as capacitors for said distributed LC network.

10. The electronic circuit of claim 1 wherein:
said inductor coils disposed on the top surface of said semiconductor substrate configured as a circular coil to function as inductors for said LC network and electrically contacting to said MOS trenches.

11. The electronic circuit of claim 1 wherein:
said inductor coils disposed on the top surface of said semiconductor substrate configured as a hexagonal coil to function as inductors for said LC network and electrically contacting said MOS trenches.

12. The electronic circuit of claim 1 wherein:
said inductor coils disposed on the top surface of said semiconductor substrate configured as a square coil to function as inductors for said LC network and electrically contacting said MOS trenches.

13. The electronic circuit of claim 1 wherein:
said inductor coils disposed on the top surface of said semiconductor substrate configured as an octagonal coil to function as inductors for said LC network and electrically contacting said MOS trenches.

14. The electronic circuit of claim 1 wherein:
said MOS trenches are filled with doped polysilicon with sidewalls of said MOS trenches padded with a nitride dielectric layer covering said sidewalls of said MOS trenches.

15. An electronic circuit comprising:
a filtering circuit comprising a linear polynomial filter includes an inductor-and-capacitor (LC) ladder network comprising metal oxide effect (MOS) trenches opened along a vertical direction in a semiconductor substrate filled with a conductive material functioning as capacitors connected to metal strips configured as inductor coils disposed on a top surface of said semiconductor constituting interconnected inductors and with said MOS trenches opened in said semiconductor substrate underneath said metal strips constituting said capacitors for said LC ladder network.

16. The electronic circuit of claim 15 wherein:
said MOS trenches are opened as parallel trenches and openned vertically into said semiconductor substrate along both sides of said metal strips.

17. The electronic circuit of claim 15 wherein:
said LC ladder network constituting a Butterworth filter circuit.

18. The electronic circuit of claim 15 wherein:
said LC ladder network constituting a Chebyshev filter circuit.

19. The electronic circuit of claim 15 wherein:
said LC ladder network constituting a Elliptic filter circuit.

20. The electronic circuit of claim 15 wherein:
said LC ladder network constituting a Butterworth filter includes represented by L2, L4, L6, ..., Ln−1, and capacitors represented by C1, C3, C5, ..., Cn wherein n is an integer representing an order of said LC ladder network and values of capacitances $C_k$ and inductance $L_k$ are represented by:

$C_k = 2 \sin[(2k-1)\pi/(2n)]/\omega_c; k=\text{odd}$ $L_k = 2 \sin[(2k-1)\pi/(2n)]/\omega_c; k=\text{even}.$ where n represents an order of the filter.

21. A method for configuring an electronic circuit comprising:
forming a filtering circuit in a semiconductor substrate as a inductor-and-capacitor (LC) network by opening a plurality of trenches along a vertical direction in said semiconductor substrate and filling said trenches with a conductive material to function as metal-oxide-semiconductor (MOS) capacitors for said distributed LC network; and
forming and configuring metal strips as inductor coils on a top surface of said semiconductor constituting interconnected inductors with said trenches opened in said semiconductor substrate underneath said metal strips constituting said MOS capacitors for said LC ladder for connecting to said MOS capacitors for said distributed LC network.

22. The method of claim 21 further comprising:
forming a transient voltage suppressing (TVS) circuit by forming an input I/O pad functioning as a collector of a bipolar transistor comprising dopant regions in said semiconductor substrate having a bottom layer functioning as an emitter and integrating said TVS with said filtering circuit as a low pass filter and forming a PN junction as a Zener diode in said semiconductor substrate with a body dopant region adjacent to a source dopant region under said input I/O pad as part of said bipolar transistor; and
integrating said TVS circuit with said LC network by forming said metal strips and said MOS trenches surrounding said I/O pad to function as said filtering circuit for said TVS.

23. The method of claim 21 wherein:
said step of forming said LC network further comprising a step of opening said MOS trenches vertically into said semiconductor substrate as parallel trenches along both sides of said metal strips to function as capacitors for said LC network.

24. The method of claim 21 wherein:
said step of integrating said TVS circuit with said LC network further comprising a step of forming said input I/O pad of said bipolar transistor as part of to said metal strip for inputting a transient voltage to said TVS circuit.

* * * * *